US012640747B2

(12) United States Patent
Li et al.

(10) Patent No.: US 12,640,747 B2
(45) Date of Patent: May 26, 2026

(54) LOW-VOLTAGE REFERENCE BUFFER WITH WIDE OUTPUT VOLTAGE AND CURRENT RANGE

(71) Applicant: Avago Technologies International Sales Pte. Limited, Singapore (SG)

(72) Inventors: Xiaoliang Li, Irvine, CA (US); Chang Liu, Irvine, CA (US); Boyu Hu, Irvine, CA (US); Guansheng Li, Irvine, CA (US); Delong Cui, Tustin, CA (US); Jun Cao, Irvine, CA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 85 days.

(21) Appl. No.: 18/649,942

(22) Filed: Apr. 29, 2024

(65) Prior Publication Data

US 2025/0337428 A1 Oct. 30, 2025

(51) Int. Cl.
| | |
|---|---|
| *H03M 1/12* | (2006.01) |
| *H03F 3/45* | (2006.01) |
| *H03M 1/06* | (2006.01) |
| *H03M 1/10* | (2006.01) |
| *H03M 1/38* | (2006.01) |

(52) U.S. Cl.
CPC .......... *H03M 1/12* (2013.01); *H03F 3/45475* (2013.01); *H03M 1/06* (2013.01); *H03M 1/10* (2013.01); *H03M 1/38* (2013.01)

(58) Field of Classification Search
CPC ........... H03M 1/12; H03M 1/06; H03M 1/10; H03M 1/38; H03F 3/45475
See application file for complete search history.

(56) References Cited

U.S. PATENT DOCUMENTS

| | | | | |
|---|---|---|---|---|
| 8,981,972 | B2 * | 3/2015 | Shen | H03M 1/1019 |
| | | | | 341/118 |
| 2023/0045744 | A1 * | 2/2023 | Jung | G11C 11/4093 |
| 2023/0409064 | A1 | 12/2023 | Upadhyaya et al. | |

FOREIGN PATENT DOCUMENTS

| | | |
|---|---|---|
| CN | 114647268 A | 6/2022 |

OTHER PUBLICATIONS

Extended European Search Report, European Application No. 25172492.8 dated Sep. 15, 2025, 14 pages.

(Continued)

*Primary Examiner* — Joseph J Lauture
(74) *Attorney, Agent, or Firm* — King Intellectual Asset Management

(57) ABSTRACT

A reference buffer with wide output voltage and current range is provided. A reference buffer includes an error amplifier comprising a first input, a second input, and a first output, wherein the amplifier is configured to generate an output signal indicative of an error between an output reference signal and an internal reference signal. The reference buffer further includes a first voltage follower circuit configured to generate the output reference signal based, at least in part, on the output signal of the error amplifier, wherein the first voltage follower comprises a third input and a second output, and wherein the second output is coupled to the second input of the error amplifier.

20 Claims, 4 Drawing Sheets

(56) References Cited

OTHER PUBLICATIONS

Chan Chi-Hang et al: "60-dB SNDR 100—MS/s SAR ADCs With Threshold Reconfigurable Reference Error Calibration", IEEE Journal of Solid-State Circuits, IEEE, USA, vol. 52, No. 10, Aug. 4, 2017 (Aug. 4, 2017), pp. 2576-2588, XP011661125, ISSN: 0018-9200, DOI: 10.1109/JSSC.2017.2728784 [retrieved on Sep. 21, 2017] *p. 2584, right-hand column, lines 14-16; figures 1,3,11*, 14 pages.

Surkanti Punith R et al: "Flipped Voltage Follower Based Low Dropout (LDO) Voltage Regulators: A Tutorial Overview", 2018 31st International Conference on VLSI Design and 2018 17th International Conference on Embedded Systems (VLSID), IEEE, Jan. 6, 2018 (Jan. 6, 2018), pp. 232-237, XP033342129, DOI: 10.1109/VLSID.2018.68 [retrieved on Mar. 27, 2018] *last paragraph; p. 233, right-hand column; figure 6a+, 6 pages.

* cited by examiner

200

LOW-VOLTAGE REFERENCE BUFFER WITH WIDE OUTPUT VOLTAGE AND CURRENT RANGE

COPYRIGHT STATEMENT

A portion of the disclosure of this patent document contains material that is subject to copyright protection. The copyright owner has no objection to the facsimile reproduction by anyone of the patent document or the patent disclosure as it appears in the Patent and Trademark Office patent file or records, but otherwise reserves all copyright rights whatsoever.

FIELD

The present disclosure relates, in general, to methods, systems, and apparatuses for a reference buffer in an analog-to-digital converter (ADC).

BACKGROUND

Continued downscaling in ADCs has led to the utilization of downscaled voltage supplies to maintain reliability and power efficiency. Threshold voltages, however, do not downscale proportionally, leading to leakage. Specifically, reference buffer designs in ADCs utilize relatively constant reference voltages to mitigate noise (and preserve signal-to-noise ratio (SNR)) that does not scale with the reduced supply voltages. Thus, conventional approaches utilizing a dedicated high voltage supply have resulted in reliability issues.

Accordingly, a low-voltage reference buffer with a wide output voltage and current range is provided.

BRIEF DESCRIPTION OF THE DRAWINGS

A further understanding of the nature and advantages of particular embodiments may be realized by reference to the remaining portions of the specification and the drawings, in which like reference numerals are used to refer to similar components. In some instances, a sub-label is associated with a reference numeral to denote one of multiple similar components. When reference is made to a reference numeral without specification to an existing sub-label, it is intended to refer to all such multiple similar components.

DETAILED DESCRIPTION OF EMBODIMENTS

Figure 1:
FIG. 1 is a schematic block diagram of an analog-to-digital converter, in accordance with various embodiments.
Figure 1:
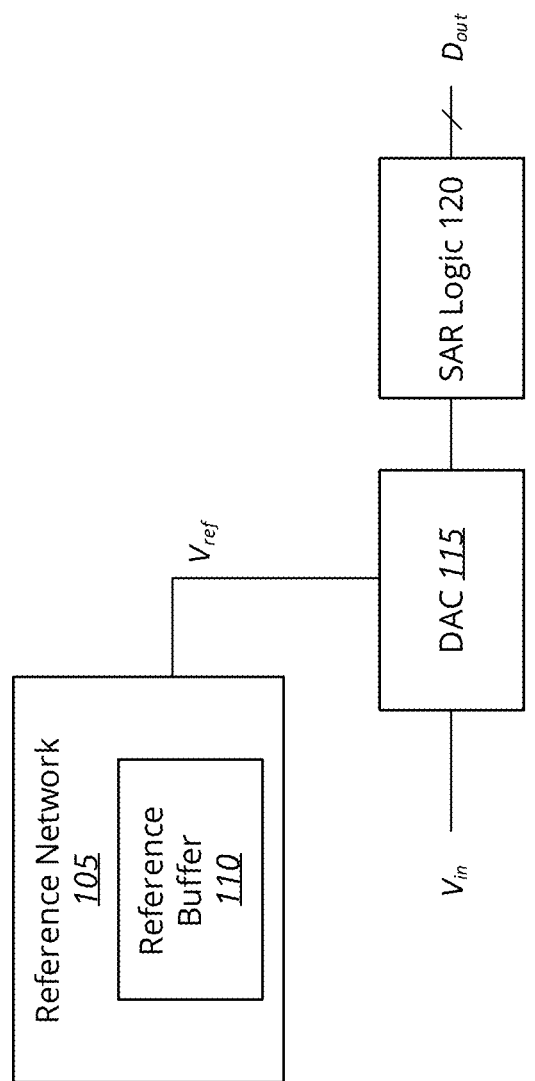

Various embodiments set forth an architecture for a reference buffer with wide output voltage and current range.

In some embodiments, a circuit for a reference buffer with wide output voltage and current range is provided. The circuit includes an amplifier comprising a first input, a second input, and a first output, wherein the amplifier is configured to generate an output signal at the first output of the amplifier based, at least in part, on a voltage difference between the first and second input, and a voltage follower configured to generate the first reference signal based, at least in part, on the output signal, wherein the voltage follower comprises a third input and a second output. The voltage follower includes a first transistor configured to receive the output of the amplifier at the third input of the voltage follower, wherein the first transistor comprises a first gate, first source, and first drain, wherein the first gate of the first transistor is the third input of the voltage follower, wherein the first gate is coupled to the first output of the amplifier, wherein the first source is the second output of the voltage follower, and a second transistor coupled to the first transistor, wherein the second transistor comprises a second gate, second drain, and second source, wherein the second drain of the second transistor is coupled to the first source of the first transistor, and the second gate of second transistor is coupled to the first drain of the first transistor. The voltage follower further includes a third transistor coupled to the first transistor, the third transistor comprising a third gate, third source, and third drain, wherein the third drain of the third transistor is coupled to the first drain of the first transistor.

In further embodiments, a reference buffer with wide output voltage and current range is provided. The reference buffer includes an error amplifier comprising a first input, a second input, and a first output, wherein the amplifier is configured to generate an output signal indicative of an error between an output reference signal and an internal reference signal. The reference buffer further includes a first voltage follower circuit configured to generate the output reference signal based, at least in part, on the output signal of the error amplifier, wherein the first voltage follower comprises a third input and a second output, and wherein the second output is coupled to the second input of the error amplifier.

In further embodiments, an ADC with a reference buffer with wide output voltage and current range is provided. The ADC includes a reference buffer configured to generate an output reference voltage, and a digital to analog converter coupled to the reference buffer and configured to receive the output reference voltage. The reference buffer includes an error amplifier comprising a first input, a second input, and a first output, wherein the amplifier is configured to generate an output signal indicative of an error between an output reference signal and an internal reference signal, and a first voltage follower circuit configured to generate the output reference signal based, at least in part, on the output signal of the error amplifier, wherein the first voltage follower comprises a third input and a second output, wherein the second output is coupled to the second input of the error amplifier.

In the following description, for the purposes of explanation, numerous details are set forth to provide a thorough understanding of the described embodiments. It will be apparent to one skilled in the art, however, that other embodiments may be practiced without some of these details. Several embodiments are described herein, and while various features are ascribed to different embodiments, it should be appreciated that the features described with respect to one embodiment may be incorporated with other embodiments as well. By the same token, however, no single feature or features of any described embodiment should be considered essential to every embodiment of the invention, as other embodiments of the invention may omit such features.

When an element is referred to herein as being "connected" or "coupled" to another element (which includes mechanically, electrically, or communicatively connecting or coupling), it is to be understood that the elements can be directly connected to the other element, or have intervening elements present between the elements. In contrast, when an element is referred to as being "directly connected" or "directly coupled" to another element, it should be understood that no intervening elements are present in the "direct" connection between the elements. However, the existence of a direct connection does not exclude other connections, in which intervening elements may be present.

When an element is referred to herein as being "disposed" in some manner relative to another element (e.g., disposed on, disposed between, disposed under, disposed adjacent to, or disposed in some other relative manner), it is to be understood that the elements can be directly disposed relative to the other element (e.g., disposed directly on another element), or have intervening elements present between the elements. In contrast, when an element is referred to as being "disposed directly" relative to another element, it should be understood that no intervening elements are present in the "direct" example. However, the existence of a direct disposition does not exclude other examples in which intervening elements may be present.

Moreover, the terms left, right, front, back, top, bottom, forward, reverse, clockwise and counterclockwise are used for purposes of explanation only and are not limited to any fixed direction or orientation. Rather, they are used merely to indicate relative locations and/or directions between various parts of an object and/or components.

Furthermore, the methods and processes described herein may be described in a particular order for ease of description. However, it should be understood that, unless the context dictates otherwise, intervening processes may take place before and/or after any portion of the described process, and further various procedures may be reordered, added, and/or omitted in accordance with various embodiments.

Unless otherwise indicated, all numbers used herein to express quantities, dimensions, and so forth should be understood as being modified in all instances by the term "about." In this application, the use of the singular includes the plural unless specifically stated otherwise, and use of the terms "and" and "or" means "and/or" unless otherwise indicated. Moreover, the use of the terms "including" and "having," as well as other forms, such as "includes," "included," "has," "have," and "had," should be considered non-exclusive. Also, terms such as "element" or "component" encompass both elements and components comprising one unit and elements and components that comprise more than one unit, unless specifically stated otherwise.

As used herein, the phrase "at least one of" preceding a series of items, with the term "and" or "or" to separate any of the items, modifies the list as a whole, rather than each member of the list (i.e., each item). The phrase "at least one of" does not require selection of at least one of each item listed; rather, the phrase allows a meaning that includes at least one of any one of the items, and/or at least one of any combination of the items. By way of example, the phrases "at least one of A, B, and C" or "at least one of A, B, or C" each refer to only A, only B, or only C; and/or any combination of A, B, and C. In instances where it is intended that a selection be of "at least one of each of A, B, and C," or alternatively, "at least one of A, at least one of B, and at least one of C," it is expressly described as such.

As ADCs have downscaled, supply voltages have also downscaled to maintain reliability and improve power efficiency. However, relatively large threshold voltage does not downscale proportionally to suppress leakage current. Unlike digital circuits that benefit from these two factors, analog circuit design, such as reference buffer design in the ADC, becomes significantly more challenging. This is due to the fact the reference buffer needs to provide a relatively constant reference voltage to maintain ADC signal-to-noise ratio, as noise does not scale down with technology. Conventionally, a dedicated high supply voltage is utilized to power reference buffers. However, high supply voltage generally leads to reliability and other design issues. Therefore, innovative techniques are in demand to enable reference buffers to work in a truly low-voltage fashion in the future standard CMOS technology.

The analog front-end (AFE) in receivers typically requires a certain amount of gain adjustment. At certain process nodes, the max gain-bandwidth product is limited by the technology. Future wideband communication systems continue driving wider bandwidth requirements, hence posing significant challenges in maintaining the feature of adequate gain adjustment in AFE within targeted power consumption. A reference buffer is set forth below, and configured to provide gain adjustment, while maintaining power efficiency by operating at a significantly lower frequency compared to AFE. Moreover, the reference buffer's output voltage can be made programmable to offer extra gain adjustment. A wide output voltage range is desired to provide adequate gain adjustment.

With the ever-increasing data rate, analog-to-digital converters (ADCs) are desired to operate at extremely high sampling frequencies. This in turn requires the reference buffer to be capable of sourcing large load currents with low output impedance to charge the capacitor digital-to-analog converter (CDAC) in ADCs. In typical approaches, a super source follower (SSF) or flipped voltage follower (FVF) may be implemented to provide low output impedance. However, conventional SSF and FVF-based reference buffers are typically prone to headroom issues under downscaling supply voltages. Furthermore, wide loading current range inevitably introduces dramatic voltage change that worsens headroom issues.

Thus, conventional approaches utilizing a dedicated high voltage supply have resulted in reliability issues. Accordingly, a reference buffer architecture is set forth below for high-speed, high-resolution ADCs, exhibiting high power supply rejection ratio (PSRR), low reference error, low output impedance, and low noise. Moreover, the reference buffer architecture set forth below features a wide output voltage and current range across Process-Voltage-Temperature-Extraction (PVTE) corners.

FIG. 1 is a schematic block diagram of an ADC 100, in accordance with various embodiments. The ADC 100 includes a reference network 105, which includes reference buffer 110, digital to analog converter (DAC) 115, and successive approximation register (SAR) logic 120. It should be noted that the various elements of the ADC 100 are schematically illustrated in FIG. 1, and that modifications to the various components and other arrangements of the ADC 100 may be possible and in accordance with the various embodiments.

In various embodiments, the ADC 100 may include, without limitation, a SAR ADC, such as a differential ADC. As such, the ADC may employ a capacitive DAC (e.g., DAC 115), such as a switched-capacitor (SC) DAC to store an input, and SAR logic 120 to perform a binary search approximation of the input signal. For example, in various embodiments, a sample and hold (S/H) circuit may sample an input signal ($V_{in}$) and pass the signal forward, in this example, to the DAC 115. In various embodiments, the DAC 110 may be a SC DAC. The output of the DAC 115 may be transmitted to a comparator 115, which may be configured to compare the output of the DAC 115 with a reference voltage, for example, as generated by the reference network 105. The comparator then provides the output to SAR logic 120, which then generates a code (e.g., a digital output, $D_{out}$) representative of the input signal.

Accordingly, in various embodiments, the DAC 110 may be a differential DAC. It is to be understood that in other embodiments, different architectures for the ADC may be utilized, such as a single-ended architecture utilizing only a single input signal, or pseudo-differential arrangement, and that embodiments are not limited to the fully differential arrangement depicted.

In various embodiments, SAR logic 120, may generate a digital code, which may then be fed back to the DAC 115 for comparison to $V_{ref}$. In various examples, the DAC 100 include one or more capacitor arrays, each array having an n-number of unit capacitors (e.g., $C_0$-$C_{n-1}$), where n is an integer. In such examples, the SAR logic 120 may be configured to output an n-bit code based, at least in part, on the output of the comparator. Although a binary-weighted SC DAC array is described in this and other examples for purposes of explanation, it is to be understood that in other embodiments, the DAC 115 may include non-binary weighted SC DAC arrays, and that the DAC 115 is not limited to any one implementation of the SC DAC array. As used herein, "logic" may refer to logic implemented in hardware (e.g., a logic circuit, programmable logic, etc.), software, and/or hardware and software.

The reference network 105, in various embodiments, refers to a circuitry (e.g., a circuit) configured to generate the reference signal, $V_{ref}$, also referred to herein as an "output reference signal." In various examples, the reference network 105 may include, for example, the reference buffer 110, among other components (e.g., voltage sources, dividers, amplifiers, etc.). The architecture of the reference buffer 110 and its components are set forth below in greater detail with reference to FIGS. 2-4. The reference buffer 110, as previously described, provides a stable, low output impedance reference voltage. The reference buffer 110, accordingly, may be configured to buffer, amplify, and/or otherwise condition the reference signal to maintain a stable reference signal. In various examples, the reference buffer 110 may include an error amplifier, FVF loop (e.g., an output stage), fractional feedback loop, and level shifter. As used herein, the error amplifier may be a component and/or circuit within the reference buffer 110 that is configured to compare the reference signal against an internal reference signal $V_{ref, in}$.

Figure 2:
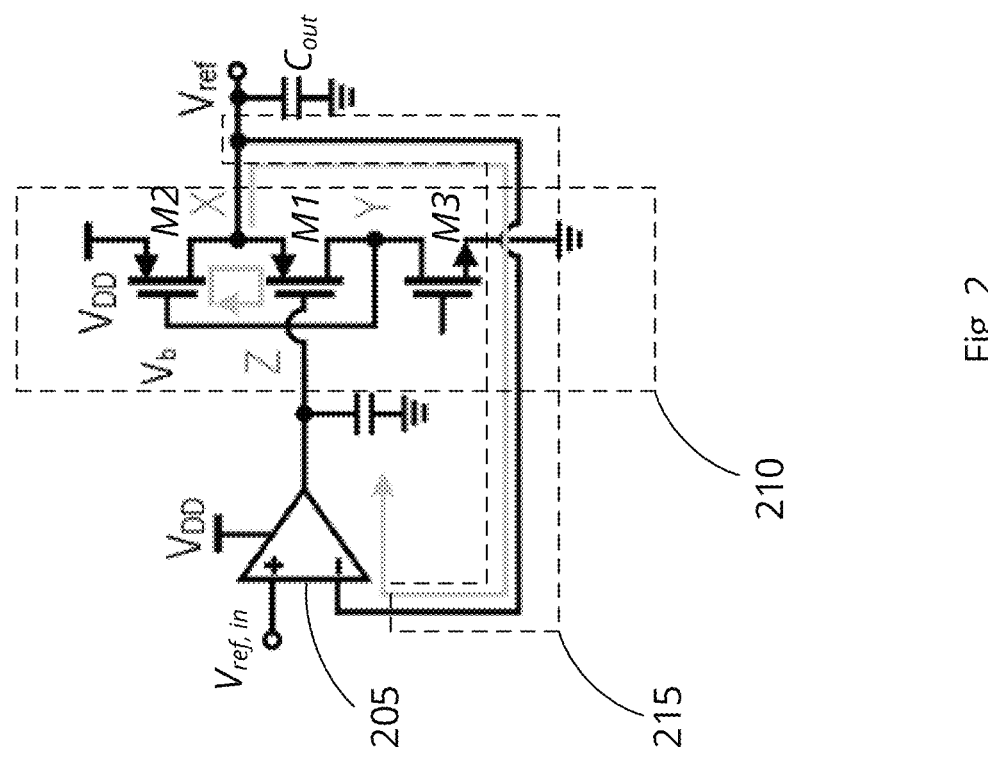
FIG. 2 is a schematic diagram of a flipped voltage follower-based reference buffer architecture, in accordance with various embodiments.
Figure 2:

FIG. 2 is a schematic diagram of a FVF-based reference buffer architecture 200, in accordance with various embodiments. The FVF-based reference buffer architecture may include an error amplifier 205, FVF 210, and feedback loop 215. In this example, an FVF 210 may form the output stage of the reference buffer 200. An FVF 210, as compared to a conventional p-type source follower (PSF) based architecture, removes the current mirror path to eliminate reference error sources.

In some embodiments, an output of the error amplifier 205 is used to drive the input of FVF 210, and the output of the FVF 210 (e.g., the reference signal, $V_{ref}$) is used as feedback into the input of the error amplifier 205, forming feedback loop 215. The error amplifier 205 may, accordingly, compare the reference signal ($V_{ref}$) output by the FVF 210 to an internal reference signal ($V_{ref, in}$). The output of the error amplifier 205 at node Z, $V_Z$, may accordingly indicate an error (e.g., voltage difference) between the $V_{ref}$ and $V_{ref, in}$.

In various embodiments, at low frequency, both the feedback loop 215 and a local loop of the FVF (e.g., the loop formed between transistors M1 and M2) may help improve (e.g., increase) PSRR & reduce reference error. For example, in some embodiments, a p-type FVF can provide large source current without dissipating large quiescent current, which saves power dramatically. As frequency increases, the feedback loop 215 gain may decrease, and the local loop of the FVF 210 may act to suppress power supply noise effectively. Although the gain of the local loop of the FVF may also decrease, the output capacitor ($C_{out}$) may activate, thereby increasing PSRR.

Compared to conventional p-type source follower (PSF) based reference buffer, the proposed architecture 200 achieves better (e.g., higher) PSRR at both low and mid-band frequency. Additionally, it features better low-frequency PSRR compared to an FVF alone. Furthermore, the architecture 200 features low output impedance.

As used herein, the FVF 210 is a type of voltage follower circuit, arranged in an FVF arrangement. Specifically, a gate of a first transistor (M1) is biased by an input signal, the source of a second transistor (M2) is coupled to a supply voltage ($V_{DD}$), the drain of the second transistor may be coupled to the source of the first transistor M1, and the gate of M2 coupled to the drain of M1. In some examples, both M1 and M2 may be p-type transistors (e.g., a p-type metal-oxide-semiconductor (PMOS) transistor, having a p-type source/drain). The drain of M1 may further be coupled to a drain of a third transistor M3. In some examples, the third transistor may be an n-type transistor (e.g., a n-type metal-oxide semiconductor (NMOS) transistor, having a n-type source/drain), wherein M1 and M2 are p-type transistors. Accordingly, in various examples, the first transistor, M1, may be an input transistor configured to receive an input signal at a respective gate of the first transistor. The second transistor, M2, may be a shunt feedback transistor, and third transistor, M3, configured to be a bias transistor. The FVF 210 may, accordingly, be configured to output a $V_{ref}$ which tracks the input signal, such as the output of the error amplifier 205 (e.g., $V_Z$). In various examples, the output of the FVF 210 maybe coupled to the same node as the source of the first transistor and drain of the second transistor (e.g., the source of the first transistor is coupled to the output of the FVF 210).

Figure 3:
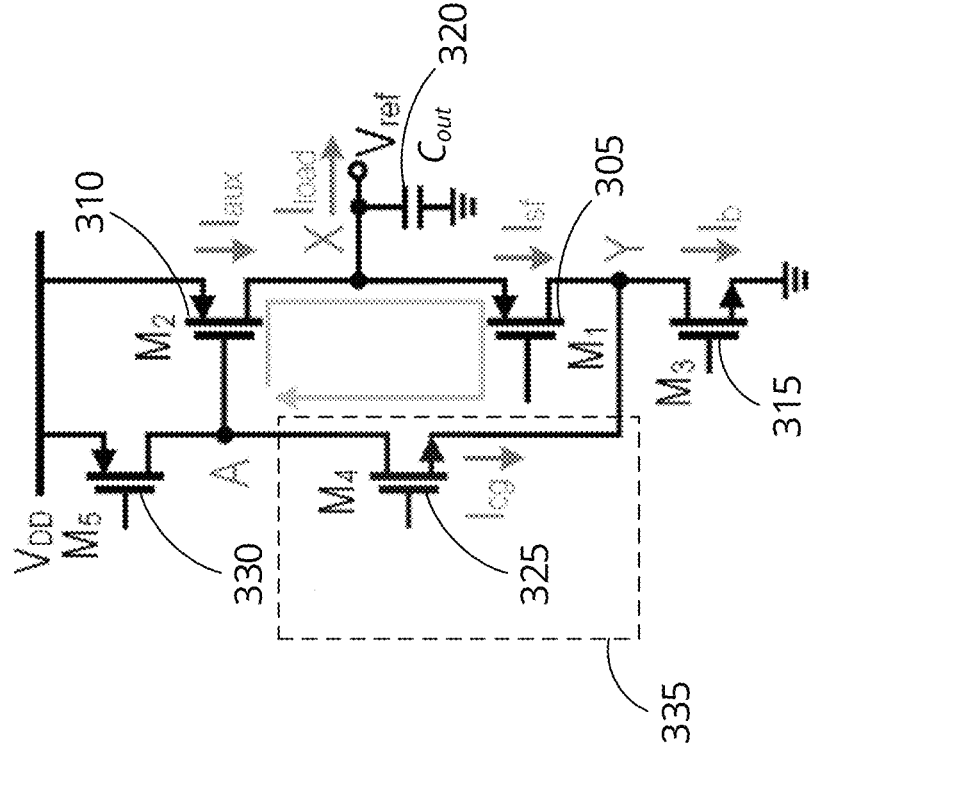
FIG. 3 is a schematic circuit diagram of a common-gate assisted flipped voltage follower, in accordance with various embodiments.

FIG. 3 is a schematic circuit diagram of a common-gate assisted FVF 300, in accordance with various embodiments. As previously described with respect to FIG. 2, the FVF 300 includes a first transistor (M1) 305, second transistor (M2) 310, third transistor (M3) 315, and output capacitor ($C_{out}$) 320. However, the common-gate assisted FVF 300 further include a common-gate (CG) gain stage 335, which includes fourth transistor (M4) 325, and fifth transistor (M5) 330. In conventional FVF designs, headroom issues can become problematic across PVTE corners as supply voltages downscale.

For example, in conventional FVF arrangements, at slow process and low-voltage corners, at maximum load current ($I_{load,max}$), the gate-source voltage of M2 310 ($V_{gs,M2}$) is at a maximum value, and the voltage at node Y ($V_Y$), (e.g., between M1 305 and M3 315), becomes low, pushing the M3 315 into the triode region and degrading loop gain. At fast process and high-voltage corners, at minimum load current ($I_{load,min}$) and low $V_{ref}$, $V_{gs,M2}$ is at a minimum value and $V_Y$ becomes high (e.g., close to $V_{ref}$), pushing M1 into the triode region, and degrading loop gain.

Accordingly, in a CG assisted FVF, such as FVF 300, a CG gain stage 335 is provided. The CG gains stage 335 may be added to an FVF loop (described above). The CG gain stage 335 may be configured to act as a cascode transistor in the FVF loop. Specifically, the CG gain stage 335 may be implemented via M4 325, to act as a common gate amplifier. In combination with the FVF (e.g., M1 305, M2 310, and M3 315) form a cascode amplifier configuration (e.g., a cascode amplifier comprising the CG stage 335 and a common-source stage (FVF)). Accordingly, a cascode, as used herein, refers to a cascode amplifier (e.g., two-stage amplifier with common-source and CG stages).

Specifically, the cascode amplifier (e.g., CG gain stage 335) includes M4 325, in which the drain of M4 325 is coupled to the gate of M2 310 (e.g., node A), and the source of M4 325 is coupled to the drain of M1 305. In various examples, M4 325 may be a PMOS transistor. The fifth transistor, M5 330 may further be coupled to the CG gain stage 335, and specifically the drain of M4 325, at node A. M5 330 may further have a source coupled to the supply voltage, $V_{dd}$.

Thus, in various examples, the CG gain stage 335 may be configured to shield node Y. Therefore, node Y voltage variation may be greatly reduced when node A voltage varies due to fluctuations in load current ($I_{load}$) and $V_{ref}$, thus "shielding" node Y across PVTE corners and various operating conditions. Accordingly, in the saturation region, all transistors M1-M5 function normally under a wider range of voltage and current conditions and across PVTE conditions.

Figure 4:
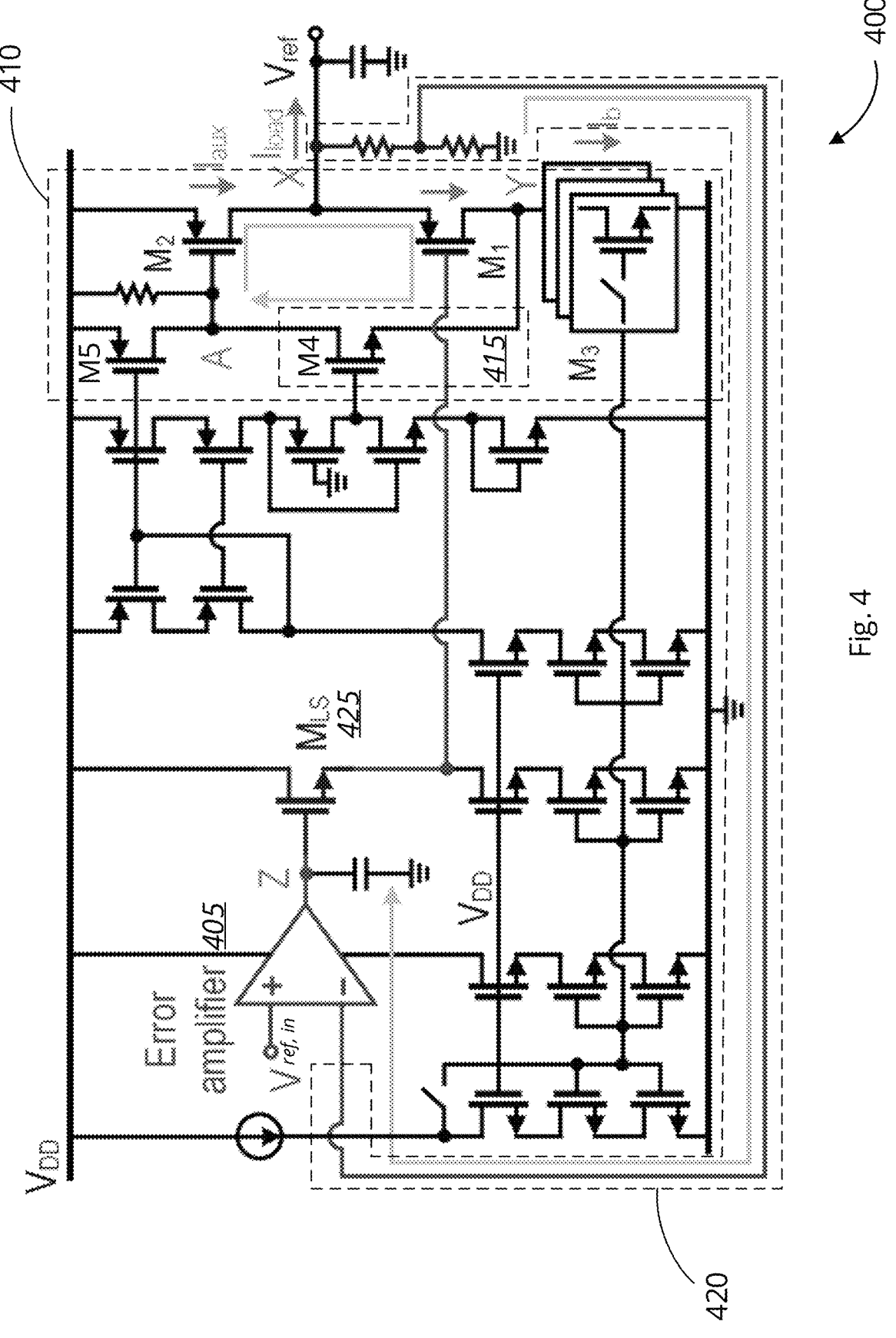
FIG. 4 is a schematic circuit diagram of a reference buffer with fractional feedback and level shifter, in accordance with various embodiments.

FIG. 4 is a schematic circuit diagram of a CG assisted reference buffer 400 with fractional feedback and level shifter, in accordance with various embodiments. The reference buffer 400 includes error amplifier 405, CG-assisted FVF 410 including CG gain stage 415, fractional feedback loop 420, and level shifter 425. It should be noted that the various elements of the reference buffer 400 are schematically illustrated in FIG. 4, and that modifications to the various components and other arrangements of the reference buffer 400 may be possible and in accordance with the various embodiments.

As previously described with respect to FIGS. 2-3, in various embodiments, reference buffer 400 includes a CG-assisted FVF 410, which further includes CG gain stage 415 and fourth transistor (M4). With conventional error amplifiers, the wide voltage and current range requirements of a reference buffer 400 poses significant challenges for the design of the error amplifier 405 under low supply voltages. For example, at maximum output reference signal voltages, a high input common mode voltage ($V_{icm}$) is exhibited for the error amplifier 405, resulting in loop gain degradation. Input common mode voltage, as used herein, refers to the average of the voltage at the two inputs of the error amplifier 405. At minimum input reference voltages, a low $V_{icm}$ and error amplifier 405 output voltage ($V_Z$) results, again leading to loop gain degradation. Conventional approaches to addressing headroom issues, such as a complementary p-type and n-type input or a two-stage structure, results in other issues, such as large transconductance variation, loop stability issues, and complicated designs. Accordingly, headroom, as used herein, refers to the "headroom" of an amplifier (e.g., additional power available to the amplifier at certain operating conditions before reaching a maximum power).

In various embodiments, in combining the CG-assisted FVF 410 with the error amplifier 405, the reference buffer 400 further implements a fractional feedback loop 420 and level shifter 425 to address headroom issues. Specifically, in various examples, the fractional feedback loop 420 may include a voltage divider configured to provide a fractional voltage based on $V_{ref}$ as the non-inverting input of the error amplifier 405. Thus, by using a fraction of $V_{ref}$ as input (e.g., $V_{ref,\ in}$), $V_{icm}$ is scaled down (e.g., decreased), and further decreases the variation range of $V_{icm}$. Thus, headroom at the input of a p-type error amplifier (e.g., error amplifier 405) may be relaxed (e.g., more headroom).

In various embodiments, a level shifter 425 may be implemented at the output of the error amplifier to further alleviate headroom issues. For example, in some embodiments, the level shifter 425 may be a complementary source follower implemented as a level shift transistor ($M_{LS}$), configured to cancel level shift introduced by the source follower in FVF. As used herein, "level shift" refers to a shift in a direct current (DC) offset level of a signal, such as supply voltage, $V_Z$, $V_{ref}$, etc. In some examples, the newly introduced pole (e.g., by $M_{LS}$ 425) may be set at a very high frequency, thereby eliminating any impact on stability.

According to various embodiments, the level shifter $M_{LS}$ 425 may have a gate coupled to the output of the error amplifier (node Z). A drain of the $M_{LS}$ 425 may be coupled to supply voltage ($V_{DD}$), and a source of the $M_{LS}$ 425 may be coupled to the gate of the first transistor M1 of the CG-assisted FVF 410. In this manner, the error amplifier 405, level shifter 425, fractional feedback loop 420, and CG-assisted FVF 410 and CG gain stage 415 are incorporated into the reference buffer 400. In some examples, the $M_{LS}$ 425 may be referred to as a "fourth" transistor for purposes of differentiation from the transistors of the FVF loop (e.g., M1, M2, and M3).

In various examples, the reference buffer may be considered to have two loops: a main loop and an FVF loop. The main loop may include the error amplifier output, $V_Z$, which is fed into the input of source follower M1, the output of which ($V_{ref}$) output is fed back to the inverting input of the error amplifier 405. Specifically, the output of the error amplifier $V_z$ is first fed to the input of the level shifter (e.g., the gate of $M_{LS}$), which in is coupled to the gate of M1. The output $V_{ref}$ is divided, via a voltage divider, and the fractional feedback (e.g., the divided $V_{ref}$ signal) is fed back into the inverting input of the error amplifier 405. This loop is utilized to ensure good PSRR at low frequencies and improve reference error. The second loop may be a CG-assisted FVF 410 loop. The source follower M1 drain is through the CG gain stage 415, and feeds back to the gate of M2. In various examples, this loop may be employed to ensure good PSRR at mid-band frequency and improve reference accuracy. In further examples, the error amplifier 405 may be implemented as a single-stage folded cascode amplifier.

In this manner, low impedance and wide output reference signal voltage range and current range may be maintained across PVTE corners. High PSRR may also be maintained across the full operational spectrum.

Compared to the conventional FVF based reference buffer, the reference buffer 400 architecture set forth above improves PSRR across whole spectrum (e.g., >20 dB at low-band, >10 dB at mid-band, and >20 dB at high-band), suppresses reference error, achieves good stability, and features much wider voltage (e.g., >40%) and current range across PVTE. Moreover, the reference buffer 400 achieves much lower output impedance (e.g., >10× lower) with reduced power (e.g., >40% reduction), hence reducing settling time & improving power efficiency. Additionally, high PSRR is supported across much wider frequency range $f_{range}$ (e.g., $f_{range}$ is extended from 10 MHz to >56 GHz).

This results in improvements to an ADC's effective number of bits (ENOB), in turn improving a serializer/deserializer (SerDes) bit error rate (BER).

While some features and aspects have been described with respect to the embodiments, one skilled in the art will recognize that numerous modifications are possible. For example, while various methods and processes described herein may be described with respect to particular structural and/or functional components for ease of description, methods provided by various embodiments are not limited to any particular structural and/or functional architecture but instead can be implemented in any suitable hardware configuration. Similarly, while some functionality is ascribed to one or more system components, unless the context dictates otherwise, this functionality can be distributed among various other system components in accordance with the several embodiments.

Moreover, while the procedures of the methods and processes described herein are described in a particular order for ease of description, unless the context dictates otherwise, various procedures may be reordered, added, and/or omitted in accordance with various embodiments. Moreover, the procedures described with respect to one method or process may be incorporated within other described methods or processes; likewise, system components described according to a particular structural architecture and/or with respect to one system may be organized in alternative structural architectures and/or incorporated within other described systems. Hence, while various embodiments are described with or without some features for ease of description and to illustrate aspects of those embodiments, the various components and/or features described herein with respect to a particular embodiment can be substituted, added and/or subtracted from among other described embodiments, unless the context dictates otherwise. Consequently, although several embodiments are described above, it will be appreciated that the invention is intended to cover all modifications and equivalents within the scope of the following claims.

What is claimed is:

1. A circuit comprising:
an amplifier comprising a first input, a second input, and a first output, wherein the amplifier is configured to generate an output signal at the first output based, at least in part, on a voltage difference between the first and second input;
a voltage follower configured to generate a first reference signal based, at least in part, on the output signal, wherein the voltage follower comprises:
a third input;
a second output;
a first transistor configured to receive the output of the amplifier at the third input of the voltage follower, wherein the first transistor comprises a first gate, first source, and first drain, wherein the first gate of the first transistor is the third input of the voltage follower, wherein the first gate is coupled to the first output of the amplifier, wherein the first source is coupled to the second output of the voltage follower;
a second transistor coupled to the first transistor, wherein the second transistor comprises a second gate, second drain, and second source, wherein the second drain of the second transistor is coupled to the first source of the first transistor, and the second gate of second transistor is coupled to the first drain of the first transistor; and
a third transistor coupled to the first transistor, the third transistor comprising a third gate, third source, and third drain, wherein the third drain of the third transistor is coupled to the first drain of the first transistor.

2. The circuit of claim 1, wherein the first and second transistor are p-type transistors, and the third transistor is a n-type transistor.

3. The circuit of claim 1, wherein the first input is configured to receive a second reference signal, and the second input is configured to receive a third reference signal, wherein the third reference signal is generated based, at least in part, on the first reference signal.

4. The circuit of claim 3, further comprising a voltage divider coupled to the second output of the voltage follower, wherein the voltage divider is configured to generate the third reference signal, wherein the third reference signal is based, at least in part, on the first reference signal.

5. The circuit of claim 4, wherein the third reference signal has a voltage that is a fraction of a respective voltage of the first reference signal.

6. The circuit of claim 1, further comprising a fourth transistor, wherein the fourth transistor includes a fourth gate, fourth source, and fourth drain, wherein the fourth gate is coupled to the first output of the amplifier, and wherein the fourth transistor is configured to connect the first output of the amplifier to the first gate of the first transistor, wherein the fourth drain of the fourth transistor is coupled to the first gate of the first transistor.

7. The circuit of claim 6, wherein the fourth transistor forms at least part of a complementary source follower.

8. The circuit of claim 1, further comprising a fourth transistor that includes a fourth gate, fourth source, and fourth drain, wherein the fourth drain is coupled to the first drain of the first transistor, and a fourth source coupled to the second gate of the second transistor.

9. The circuit of claim 8, wherein the fourth transistor forms at least part of a common gate gain stage, wherein in combination with the voltage follower, forms at least part of a cascode amplifier,
wherein the circuit further comprises a fifth transistor that includes a fifth gate, fifth source, and fifth drain,
wherein the fifth source is coupled to a supply voltage, and wherein the fifth drain is coupled to the fourth drain.

10. The circuit of claim 1 further comprising a voltage divider coupled to the output of the voltage follower, wherein the voltage divider is configured to generate the third reference signal, wherein the third reference signal is based, at least in part, on the first reference signal.

11. A reference buffer comprising:
an error amplifier comprising a first input, a second input, and a first output, wherein the amplifier is configured to generate an output signal indicative of an error between an output reference signal and an internal reference signal; and
a first voltage follower circuit configured to generate the output reference signal based, at least in part, on the output signal of the error amplifier, wherein the first voltage follower comprises:
a third input;
a second output, wherein the second output is coupled to the second input of the error amplifier;
a first transistor configured to receive the output signal of the error amplifier at the third input of the first voltage follower, wherein the first transistor comprises a first gate, first source, and first drain, wherein the first gate of the first transistor is the third input of the voltage follower, wherein the first gate is coupled to the first output of the error amplifier, wherein the first source is coupled to the second output of the first voltage follower;

a second transistor coupled to the first transistor, wherein the second transistor comprises a second gate, second drain, and second source, wherein the second drain of the second transistor is coupled to the first source of the first transistor, and the second gate of second transistor is coupled to the first drain of the first transistor; and a third transistor coupled to the first transistor, the third transistor comprising a third gate, third source, and third drain, wherein the third drain of the third transistor is coupled to the first drain of the first transistor.

12. The reference buffer of claim 11, wherein the first and second transistor are p-type transistors, and the third transistor is a n-type transistor.

13. The reference buffer of claim 11, wherein the first input is configured to receive the internal reference signal, and the second input is configured to receive a third reference signal, wherein the third reference signal is generated based, at least in part, on the output reference signal.

14. The reference buffer of claim 13, further comprising a voltage divider coupled to the second output of the first voltage follower, wherein the voltage divider is configured to generate the third reference signal, wherein the third reference signal has a voltage that is a fraction of a respective voltage of the output reference signal.

15. The reference buffer of claim 11, further comprising a second voltage follower circuit comprising a fourth transistor, wherein the fourth transistor includes a fourth gate, fourth source, and fourth drain, wherein the fourth gate is coupled to the first output of the error amplifier, and wherein the fourth transistor is configured to connect the first output of the error amplifier to the first gate of the first transistor, wherein the fourth drain of the fourth transistor is coupled to the first gate of the first transistor.

16. An analog to digital converter comprising:

a reference buffer configured to generate an output reference signal, the reference buffer comprising:

an error amplifier comprising a first input, a second input, and a first output, wherein the amplifier is configured to generate an output signal indicative of an error between an output reference signal and an internal reference signal;

a first voltage follower circuit configured to generate the output reference signal based, at least in part, on the output signal of the error amplifier, wherein the first voltage follower comprises:

a third input;

a second output, wherein the second output is coupled to the second input of the error amplifier;

a first transistor configured to receive the output signal of the error amplifier at the third input of the first voltage follower, wherein the first transistor comprises a first gate, first source, and first drain, wherein the first gate of the first transistor is the third input of the voltage follower, wherein the first gate is coupled to the first output of the error amplifier, wherein the first source is coupled to the second output of the first voltage follower;

a second transistor coupled to the first transistor, wherein the second transistor comprises a second gate, second drain, and second source, wherein the second drain of the second transistor is coupled to the first source of the first transistor, and the second gate of second transistor is coupled to the first drain of the first transistor; and a third transistor coupled to the first transistor, the third transistor comprising a third gate, third source, and third drain, wherein the third drain of the third transistor is coupled to the first drain of the first transistor; and a digital to analog converter coupled to the reference buffer, and configured to receive the output reference voltage.

17. The analog to digital converter of claim 16, wherein the first and second transistor are p-type transistors, and the third transistor is a n-type transistor.

18. The analog to digital converter of claim 16, wherein the first input is configured to receive the internal reference signal, and the second input is configured to receive a third reference signal, wherein the third reference signal is generated based, at least in part, on the output reference signal.

19. The analog to digital converter of claim 18, further comprising a voltage divider coupled to the second output of the first voltage follower, wherein the voltage divider is configured to generate the third reference signal, wherein the third reference signal has a voltage that is a fraction of a respective voltage of the output reference signal.

20. The analog to digital converter of claim 16, further comprising a second voltage follower circuit comprising a fourth transistor, wherein the fourth transistor includes a fourth gate, fourth source, and fourth drain, wherein the fourth gate is coupled to the first output of the error amplifier, and wherein the fourth transistor is configured to connect the first output of the error amplifier to the first gate of the first transistor, wherein the fourth drain of the fourth transistor is coupled to the first gate of the first transistor.

* * * * *